(12) United States Patent
Fujikawa

(10) Patent No.: US 10,134,511 B2
(45) Date of Patent: Nov. 20, 2018

(54) RESISTANCE ELEMENT, ELECTROSTATIC PROTECTION CIRCUIT, TEMPERATURE DETECTION CIRCUIT, AND ELECTRO-OPTIC APPARATUS

(71) Applicant: Seiko Epson Corporation, Tokyo (JP)

(72) Inventor: Shinsuke Fujikawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 338 days.

(21) Appl. No.: 15/058,221

(22) Filed: Mar. 2, 2016

(65) Prior Publication Data

US 2016/0284446 A1    Sep. 29, 2016

(30) Foreign Application Priority Data

Mar. 26, 2015    (JP) .................................. 2015-063903
Nov. 26, 2015    (JP) .................................. 2015-230320

(51) Int. Cl.
  *G01K 7/01*    (2006.01)
  *H01C 1/14*    (2006.01)
  *H01C 7/00*    (2006.01)
  *H01L 27/04*    (2006.01)

(52) U.S. Cl.
  CPC ............. *H01C 1/14* (2013.01); *G01K 7/01* (2013.01); *H01C 7/006* (2013.01); *H01L 27/04* (2013.01)

(58) Field of Classification Search
  None
  See application file for complete search history.

(56) References Cited

U.S. PATENT DOCUMENTS

| 8,230,568 | B2 * | 7/2012 | Stafford | A47K 3/001 |
| | | | | 29/401.1 |
| 9,111,779 | B2 * | 8/2015 | Park | H01L 23/367 |
| 2010/0214705 | A1 * | 8/2010 | Kim | H01L 27/0288 |
| | | | | 361/56 |
| 2013/0278553 | A1 | 10/2013 | Suzuki et al. | |
| 2016/0123817 | A1 * | 5/2016 | Bennett | G01K 7/16 |
| | | | | 345/156 |

FOREIGN PATENT DOCUMENTS

| JP | 63-219169 A | | 9/1988 |
| JP | 01-149451 A | | 6/1989 |
| JP | 03139877 A | * | 6/1991 |
| JP | 03-171657 A | | 7/1991 |
| JP | 2013-225032 A | | 10/2013 |

* cited by examiner

*Primary Examiner* — Clayton E Labelle
*Assistant Examiner* — Leon W Rhodes, Jr.
(74) *Attorney, Agent, or Firm* — ALG Intellectual Property, LLC

(57) ABSTRACT

A resistance element includes a first electro-conductive layer that is formed on a substrate and includes a body portion and a protruding portion protruding from the body portion, and the body portion includes a current path from an input portion to an output portion. The resistance element further includes a second electro-conductive layer that is formed on the first electro-conductive layer via an insulating layer by using a material having a lower resistivity than the first electro-conductive layer. The resistance element further includes a connection portion that is provided to the insulating layer at a position corresponding to the protruding portion and includes a contact hole penetrating from the first electro-conductive layer to the second electro-conductive layer.

23 Claims, 6 Drawing Sheets

RESISTANCE ELEMENT, ELECTROSTATIC PROTECTION CIRCUIT, TEMPERATURE DETECTION CIRCUIT, AND ELECTRO-OPTIC APPARATUS

BACKGROUND

1. Technical Field

The present invention relates to a resistor element, an electrostatic protection circuit, a temperature detection circuit, and an electro-optical device.

2. Related Art

Resistance elements are used in various applications in semiconductor circuits. For example, some electrostatic protection circuits have a protection resistor for protecting a downstream circuit from a current due to static electricity. While protection resistors are often formed of a material whose resistivity is relatively high (for example, a semiconductor film), a large current due to static electricity may cause the protection resistor to be fused due to Joule heat generated when the current flows through the protection resistor. In order to address this problem, for example, in JP-A-63-219169, a technique in which a metal film is connected to the semiconductor film via a contact hole to facilitate heat dissipation of the generated Joule heat is disclosed.

In the technique disclosed in JP-A-63-219169, however, there is a problem that, with respect to the portion where the contact hole is located, a current flows through the contact hole to a metal film having a relatively low resistivity, resulting in a reduced resistance.

SUMMARY

An advantage of some aspects of the invention is that a technique which realizes both suppression of a reduction of the resistance and improvement of the heat dissipation is provided.

A first aspect of the invention provides a resistance element that has a first electro-conductive layer that is formed on a substrate and includes a body portion and a protruding portion protruding from the body portion in which the body portion includes a current path from an input portion to an output portion; a second electro-conductive layer that is formed on the first electro-conductive layer via an insulating layer by using a material having a lower resistivity than the first electro-conductive layer; and a connection portion that is provided to the insulating layer at a position corresponding to the protruding portion and includes a contact hole penetrating from the first electro-conductive layer to the second electro-conductive layer.

This resistance element realizes both suppression of a reduction of the resistance and improvement of the heat dissipation.

The protruding portion may have a first portion having a smaller sectional area of a cross section perpendicular to the substrate and parallel to the current path and a second portion having a larger sectional area of a cross section perpendicular to the substrate and parallel to the current path, and the sectional area of the first portion may be smaller than a sectional area of the body portion perpendicular to the substrate.

This resistance element can suppress a reduction of the resistance and further improve the heat dissipation.

A plurality of the contact holes may be provided to the insulating layer at a position corresponding to the second portion.

This resistance element can suppress a reduction of the resistance and further improve the heat dissipation.

The plurality of contact holes may be arranged in a direction intersecting the current path.

This resistance element can suppress a reduction of the resistance and further improve the heat dissipation.

The protruding portion may have a first protruding portion connected to the body portion and a second protruding portion connected to the first protruding portion, and the plurality of contact holes may be arranged in the first protruding portion in a direction intersecting the current path.

This resistance element can suppress a reduction of the resistance and further improve the heat dissipation.

The resistance element may have a second protruding portion protruding from the body portion in the same direction as the protruding portion, and the protruding portion and the second protruding portion may be separated from each other. That is, this resistance element has no current path passing through the protruding portion.

This resistance element can suppress a reduction of the resistance and further improve the heat dissipation.

Another aspect of the invention provides an electrostatic protection circuit having any one of the resistance elements described above.

This electrostatic protection circuit can reduce likelihood of the resistance element being fused.

A further aspect of the invention provides a temperature detection circuit having the electrostatic protection circuit described above and a temperature detection element electrically connected to the electrostatic protection circuit.

This temperature detection circuit can further improve the performance of protection against static electricity.

A still further aspect of the invention provides an electro-optical device having the temperature detection circuit described above.

This electro-optical device can further improve the performance of protection against static electricity.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. Introduction

Figure 1A:
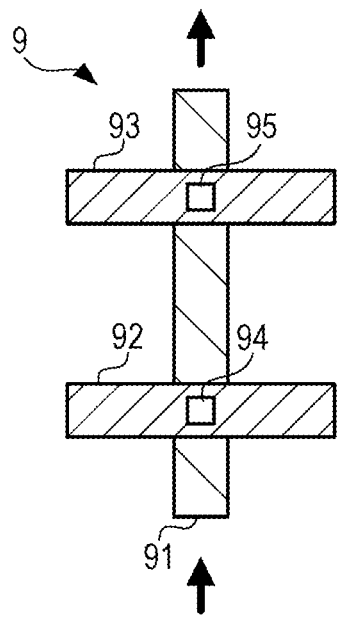
FIG. 1A is a schematic diagram illustrating a resistance element according to a related art.
Figure 1B:
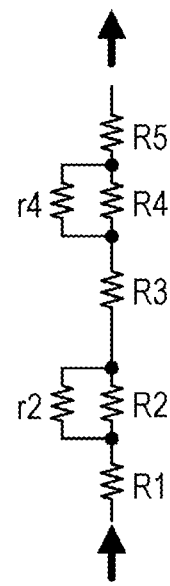
FIG. 1B is a schematic diagram illustrating the resistance element according to a related art.

FIG. 1A and FIG. 1B are schematic diagrams illustrating a resistance element 9 according to the related art. The resistance element 9 is formed of a semiconductor layer, an insulating layer, and a metal layer that are stacked on a substrate (not depicted). The semiconductor layer is formed of single-crystal Si, polycrystal Si, amorphous Si, or a compound semiconductor, for example. The insulating layer is formed of an oxide such as $SiO_2$, a nitride such as $Si_3N_4$, or a resin such as polyamide, for example. The metal layer is formed of Al, Cu, Au, or alloy based thereon, for example. FIG. 1A is a diagram illustrating a plane shape of the resistor element 9 viewed in a direction perpendicular to the substrate.

In general, an insulating layer has a poor thermal conductivity and thus has poor heat dissipation for Joule heat generated by a current passing through the semiconductor layer. To address this, in the resistance element 9, the semiconductor layer is thermally connected to the metal layer having a high thermal conductivity to improve heat dissipation.

The resistance element 9 has a body portion 91, a heat radiation portion 92, a heat radiation portion 93, a contact hole 94, and a contact hole 95. The body portion 91 is formed of a semiconductor layer. The heat radiation portions 92 and 93 are each formed of a metal layer. The contact holes 94 and 95 are holes that are formed in an insulating layer and penetrate from the semiconductor layer to the metal layer, and the metal layer is formed inside the contact holes 94 and 95. The metal layer and the semiconductor layer are insulated by the insulating layer except in the portions of the contact holes.

In this example, the lower end in FIG. 1A is an input side, and the upper end is an output side. The body portion 91 has a rectangular shape (a thin rectangle). That is, in the resistance element 9, a current flows upward in FIG. 1A. The heat radiation portions 92 and 93 are formed at positions partially overlapping the body portion 91. The heat radiation portions 92 and 93 each have a rectangular shape extending in the lateral direction in FIG. 1A. The contact holes 94 and 95 are provided on a current path of the body portion 91 at positions overlapping the heat radiation portions 92 and 93, respectively.

FIG. 1B is a diagram illustrating an equivalent circuit of the resistance element 9. In FIG. 1B, R2 and R4 represent resistances of the body portion 91 in the areas of the contact holes 94 and 95, respectively. R1, R3, and R5 represent resistances of the body portion 91 in the areas that do not overlap the heat radiation portions 92 and 93. Further, r2 represents the resistance of a current path passing through the contact hole 94 and the heat radiation portion 92, and r4 represents the resistance of a current path passing through the contact hole 95 and the heat radiation portion 93.

In the areas in which the contact holes 94 and 95 are formed, a current flows in a portion having a lower resistance, that is, in the metal layer. Therefore, a combined resistance Rall from the input to the output of the resistance element 9 is represented as:

$$Rall = R1 + r2 + R3 + r4 + R5 \quad (1).$$

In a strict sense, while the second item of the expression (1) has to be a parallel resistance of r2 and R2, the parallel resistance is approximated as r2, because r2 is much smaller than R2. For example, while the sheet resistance of a semiconductor layer may reach about several kilo ohms per square, the sheet resistance of a metal layer may be one ohm per square or less. Therefore, the parallel resistance of a semiconductor layer and a metal layer can be approximated as the resistance of the metal layer. In a similar manner, since r4 is much smaller than R4, the fourth item is also approximated as r4. The resistance of the element Rall is smaller than the following resistance Ri in the case where the heat radiation portions 92 and 93 are not provided:

$$Ri = R1 + R2 + R3 + R4 + R5 \quad (2).$$

The present embodiment addresses this problem.

2. Structure

2-1. First Example of Resistance Element

Figure 2A:
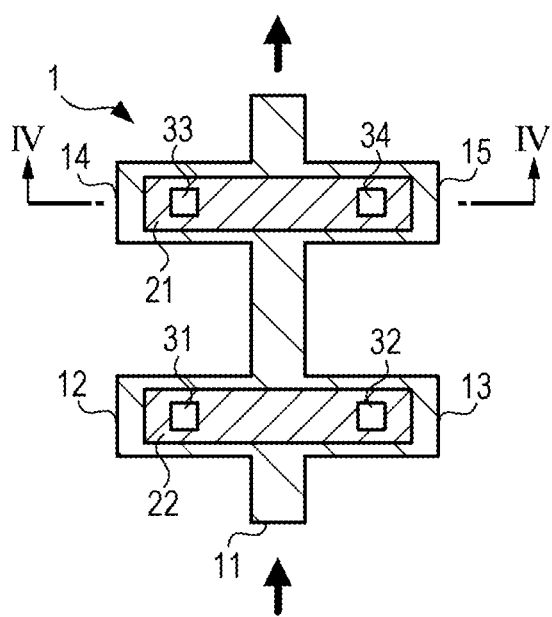
FIG. 2A is a schematic diagram illustrating the structure of a resistor element according to a first example.
Figure 2B:
FIG. 2B is a schematic diagram illustrating the structure of the resistor element according to the first example.

FIG. 2A and FIG. 2B are schematic diagrams illustrating the structure of a resistor element 1 according to a first example. The resistance element 1 is formed of a semiconductor layer (an example of the first electro-conductive layer), an insulating layer, and a metal layer (an example of the second electro-conductive layer) that are stacked on a substrate (not shown) in a similar manner to the resistance element 9. FIG. 2A is a diagram illustrating a plane shape of the resistor element 1 viewed in a direction perpendicular to the substrate.

The resistance element 1 has a body portion 11, a protruding portion 12, a protruding portion 13, a protruding portion 14, a protruding portion 15, a heat radiation portion 21, a heat radiation portion 22, a contact hole 31, a contact hole 32, a contact hole 33, and a contact hole 34. The body portion 11 and the protruding portions 12 to 15 are formed of a semiconductor layer in an integrated manner. The heat radiation portions 21 and 22 are formed of a metal layer. The contact holes 31 to 34 are holes that are formed in an insulating layer and penetrate from the semiconductor layer to the metal layer, and the metal layer is formed inside the contact holes 31 to 34 so as to form connecting portions. The metal layer and the semiconductor layer are insulated by the insulating layer except in the portions of the contact holes. Note that, while the heat radiation portions 21 and 22 are depicted as smaller portions than the protruding portions 12 to 15 in FIG. 2A for illustrative purposes, the heat radiation portions 21 and 22 may be larger than the protruding portions 12 to 15.

In this example, the lower end in FIG. 2A is an input side, and the upper end is an output side. A contact hole (not depicted) is provided to an input portion and connected to an upstream circuit and/or terminal via the metal layer. In a similar manner, a contact hole is provided to an output portion and connected to a downstream circuit via the metal layer. The body portion 11 has a rectangular shape (a thin rectangle). That is, in the resistance element 1, a current flows upward in FIG. 2A. The body portion 11 has a shape along the current path. The protruding portions 12 to 15 are portions protruding from the current path of the body portion 11.

Figure 3:
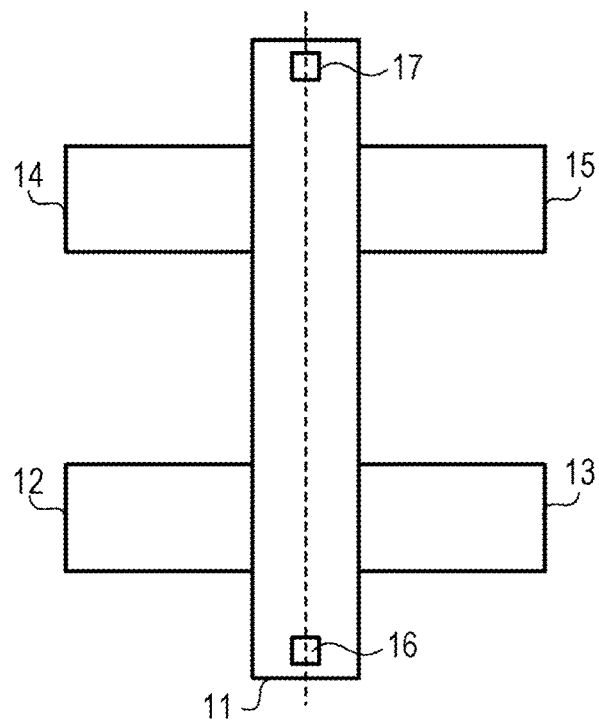
FIG. 3 is a diagram illustrating a positional relationship between a body portion and protruding portions.

FIG. 3 is a diagram illustrating a positional relationship between the body portion and the protruding portions. While formed in an integrated manner in the semiconductor layer in the actual implementation, the body portion 11 and the protruding portions 12 to 15 are depicted as separate members in FIG. 3 for illustrative purposes. In FIG. 3, an input portion 16 and an output portion 17 are depicted. Of the portion (resistor) formed of the semiconductor layer, the body portion is an area that is defined by a virtual border line parallel to a virtual center line from the input portion to the output portion (see the broken line in FIG. 3 corresponding to a virtual current path) and has the largest, constant width depending on the shape of the semiconductor layer. As used herein, the term width refers to a length in the direction perpendicular to the current path. The protruding portion refers to a portion other than the body portion defined as described above. The protruding portion can also be defined as a portion extending in a direction intersecting, in particular in a direction perpendicular to, a direction of potential difference generated when a current flows through the resistor. FIG. 3 depicts the body portion 11 and the protruding portions 12 to 15 defined by the definition as described above.

Reference is now again made to FIG. 2A. The heat radiation portions 21 and 22 are formed at a position such that parts of the heat radiation portions 21 and 22 overlap the body portion 11 and at least parts of the heat radiation portions 21 and 22 overlap the protruding portions. In this example, the heat radiation portion 21 is formed at a position overlapping the protruding portions 12 and 13, and the heat radiation portion 22 is formed at a position overlapping the protruding portions 14 and 15. Further, the heat radiation portions 21 and 22 each have a rectangular shape extending in the lateral direction in FIG. 2A.

In the heat radiation portion 22, a contact hole 31 is provided at a position overlapping the protruding portion 12, and a contact hole 32 is provided at a position overlapping the protruding portion 13. In the heat radiation portion 21, a contact hole 33 is provided at a position overlapping the protruding portion 14, and a contact hole 34 is provided at a position overlapping the protruding portion 15. Note that, while each contact hole includes two holes in particular in the example of FIG. 2A, the number and the shape of the holes are not limited thereto.

In the resistance element 1, no contact hole is provided at a position overlapping the body portion 11. That is, no contact hole is provided on the current path. Further, each protruding portion is not connected to another protruding portion and thus there is substantially no current path passing from the input portion 16 to the output portion 17 through the protruding portions.

FIG. 2B is a diagram illustrating an equivalent circuit of the resistance element 1. Note that R2 and R4 represent the resistances of the body portion 11 in the areas connected to the protruding portions 12 and 13 and the protruding portions 14 and 15, respectively. Unlike the example of FIG. 1B, since there is substantially no current path in the metal layer, it is not necessary to take the resistance of the metal layer into consideration. A combined resistance Rall from the input to the output of the resistance element 1 is represented as:

$$Rall = R1 + R2 + R3 + R4 + R5 \qquad (3).$$

Compared to the combined resistance of the resistance element 9 (Expression (1)), a decrease in the resistance due to the current path through the metal layer can be suppressed.

Figure 4:
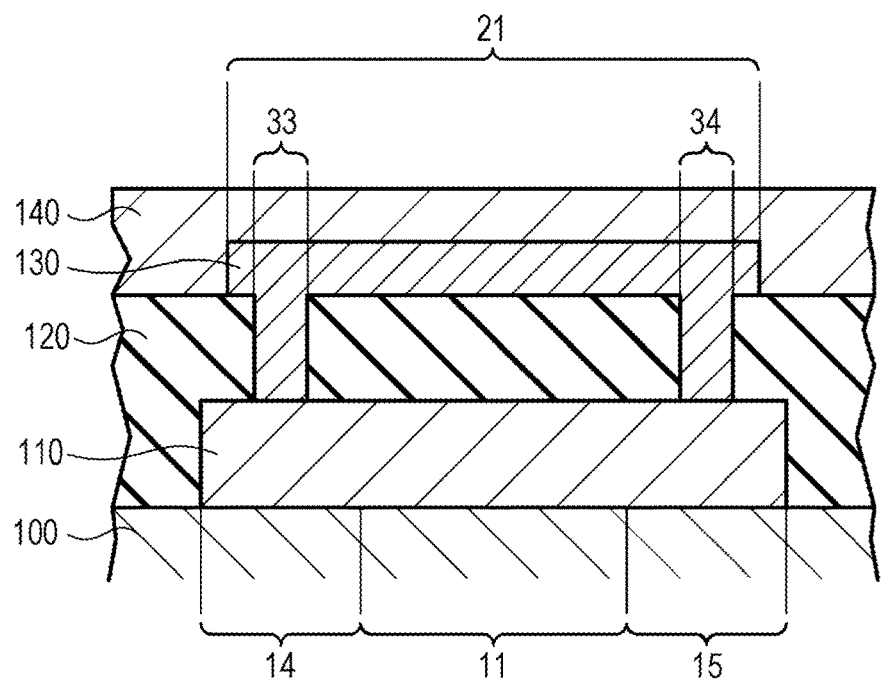
FIG. 4 is a diagram illustrating an example of sectional structure of the resistor element.

FIG. 4 is a diagram illustrating an example of sectional structure of the resistor element 1. FIG. 4 illustrates the IV-IV cross section of FIG. 2. The resistance element 1 has a structure in which a semiconductor layer 110, an insulating layer 120, a metal layer 130, and a protection layer 140 are stacked on a substrate 100. The substrate 100 is formed of a glass or a semiconductor, for example. Each layer is patterned by using lithography and etching, for example. As illustrated in FIG. 4, holes that are formed in the insulating layer 120 and penetrate to the semiconductor layer 110 are contact holes. The metal layer 130 is formed inside the contact holes. Note that FIG. 4 illustrates simplified sectional structure of the element, and other layer than is depicted may be included in the entire circuit that contains the resistor element 1.

2-2. Second Example of Resistance Element

Figure 5A:
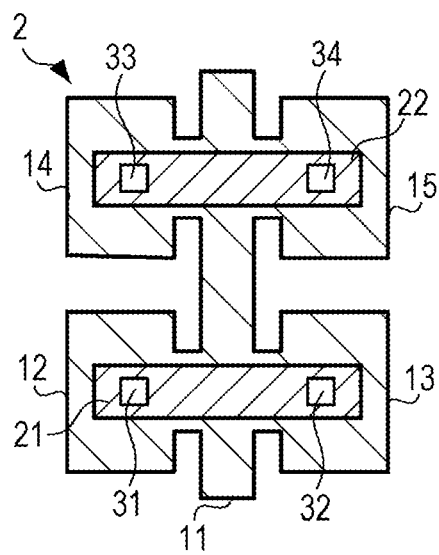
FIG. 5A is a schematic diagram illustrating the structure of a resistor element according to a second example.
Figure 5B:
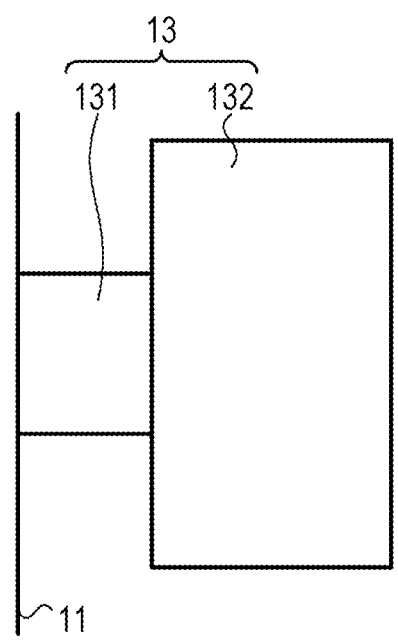
FIG. 5B is a schematic diagram illustrating the structure of the resistor element according to the second example.

FIG. 5A and FIG. 5B are schematic diagrams illustrating the structure of a resistor element 2 according to a second example. FIG. 5A is a diagram illustrating a plane shape of the resistance element 2 viewed from the direction perpendicular to the substrate. In the following, differences from the resistance element 1 will mainly be described. In the reference element 2 of this example, the shapes of the protruding portions 12 to 15 are different from those of the resistance element 1. The protruding portion 13 will be described below as an example.

In this example, the protruding portion 13 has a first portion 131 and a second portion 132 (FIG. 5B). Each of the first portion 131 and the second portion 132 has a rectangular shape. The first portion 131 is a portion that is connected directly to the body portion 11, and the second portion 132 is a portion that is connected to the body portion 11 via the first portion 131. With respect to the sectional area of a cross section that is perpendicular to the substrate and parallel to the current path, the first portion 131 is narrower than the second portion 132. Further, this sectional area of the first portion 131 is smaller than the sectional area perpendicular to the current path of the body portion 11. That is, since the first portion 131 has a limited length that contacts the body portion, the current path passing through the first portion 131 is less likely to occur. The same applies to the protruding portions 12, 14, and 15.

The volume of the protruding portions 12 to 15 of the resistance element 2 is larger than that of the resistance element 1. However, the resistance is not reduced, because there is no change in the shape of the body portion 11 and there is substantially no current path passing through the protruding portions 12 to 15 from the input portion to the output portion. Therefore, compared to the resistance element 1, a rise in the temperature can be suppressed (heat dissipation can be enhanced) while the resistance is maintained.

2-3. Third Example of Resistance Element

Figure 6:
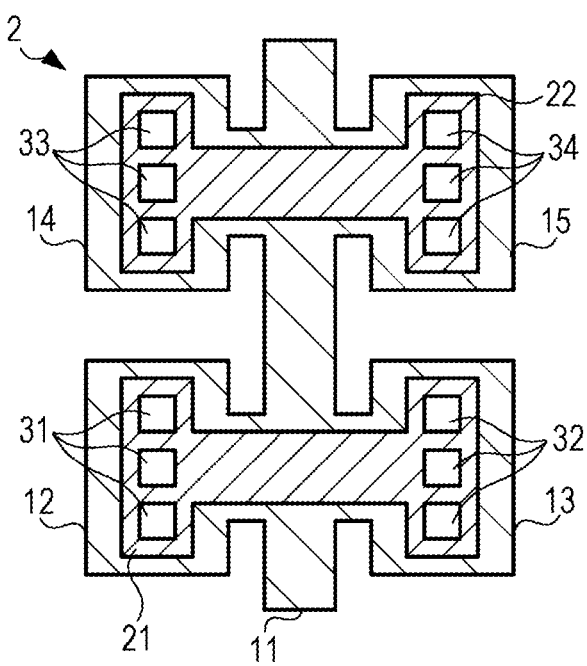
FIG. 6 is a schematic diagram illustrating the structure of a resistor element according to a third example.

FIG. 6 is a schematic diagram illustrating the structure of a resistance element 3 according to a third example. FIG. 6 is a diagram of the resistance element 3 viewed from the direction perpendicular to the substrate. In the following, differences from the resistance element 2 will mainly be described. In the resistance element 3 of this example, the shapes of the heat radiation portions 21 and 22 are different from those of the resistance element 2. Specifically, in the resistance element 3, the heat radiation portions 21 and 22 each have a H-shape. Further, compared to the resistance element 2, areas of the heat radiation portions 21 and 22 are increased. More contact holes are provided due to the increased area. Further, a plurality of contact holes are arranged in a direction parallel to the current path in this example. Since there is substantially no current path via the protruding portions, the resistance of the body portion 11 is not reduced even when the plurality of contact holes are arranged in a direction parallel to the current path.

Compared to the resistance element 2, the volume of the metal layer forming the resistance element 3 is increased and the number of contact holes (the contact area) that are to be connected to the semiconductor layer is also increased. Therefore, the heat dissipation can be further enhanced compared to the resistance element 2. Note that, while FIG. 6 depicts the heat radiation portions 21 and 22 as being smaller than the protruding portions 12 to 15 for illustrative purposes, the heat radiation portions 21 and 22 may be larger than the protruding portions 12 to 15. Further, the shape of the heat radiation portions 21 and 22 is not limited to the H-shape.

2-4. Application Example of Resistance Element

Figure 7:
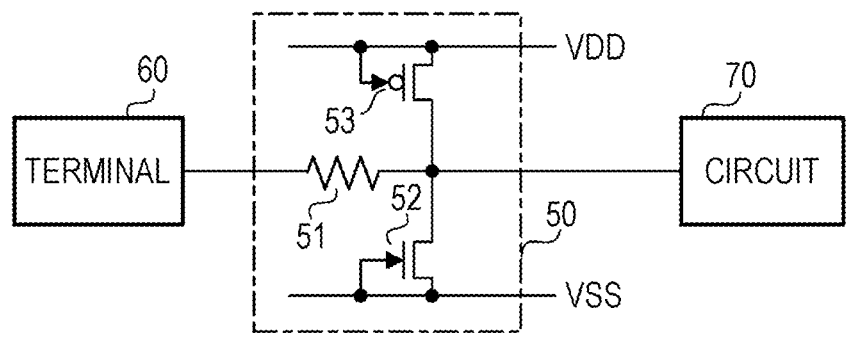
FIG. 7 is a diagram illustrating an arrangement of an electrostatic protection circuit according to one embodiment.

FIG. 7 is a diagram illustrating an arrangement of an electrostatic protection circuit 50 according to one embodiment. The electrostatic protection circuit 50 is an example of a circuit (a semiconductor device) using the resistance elements 1 to 3. In this example, the electrostatic protection circuit 50 is provided between a terminal 60 and a circuit 70 to prevent the circuit 70 from being broken down due to static electricity which would otherwise be inputted via the terminal 60.

The electrostatic protection circuit 50 has a protection resistor 51, a diode 52, and a diode 53. In this example, the diodes 52 and 53 each short-circuit a source terminal and a gate terminal of an FET (Field Effect Transistor) and prevent inputted static electricity from being supplied to the circuit 70 and guide it to a power source line VSS or VDD. The protection resistor 51 is formed of any one of the resistance elements 1 to 3 described above and can improve the heat dissipation while maintaining the resistance to be higher than in the case where the resistance element 9 is used. That is, the likelihood of the resistor (the body portion 11) being fused can be reduced.

3. Application Example of Electrostatic Protection Circuit

Figure 10:
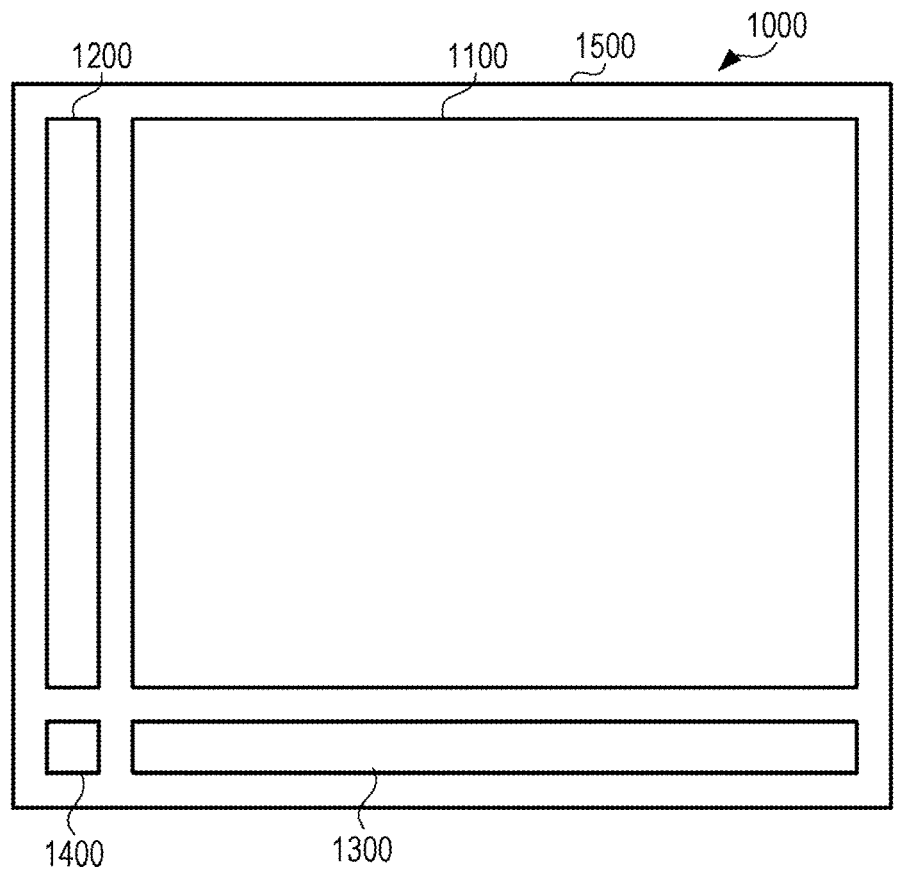
FIG. 10 is a diagram illustrating an arrangement of an electro-optical panel according to one embodiment.

FIG. 10 is a diagram illustrating an arrangement of an electro-optical panel 1000 according to one embodiment. The electro-optical panel 1000 is an example of an electro-optical device used as a light bulb of a projector or a direct-viewing display device, for example. The electro-optical panel 1000 has an electro-optical element 1100, a driving circuit 1200, a driving circuit 1300, and a temperature detection circuit 1400. The electro-optical panel 1000 is a so-called SOG (System On Glass), for example, and the driving circuits 1200 and 1300 and the temperature detection circuit 1400 are formed on a transparent substrate 1500 forming the electro-optical panel 1000.

The electro-optical element 1100 is an element such as a liquid crystal element or an organic EL (Electroluminescence) element, for example, in which a display state changes in accordance with an electrical signal. In this example, a plurality of electro-optical elements 1100 are arranged in a matrix (note that, in FIG. 10, the plurality of electro-optical elements 1100 arranged in a matrix are depicted as an integrated member). The driving circuits 1200 and 1300 are circuits for driving the electro-optical element 1100, that is, controlling the display of the plurality of electro-optical elements 1100. For example, the driving circuit 1200 is a circuit for selecting a line to be controlled from the matrix of the electro-optical elements 1100, and the driving circuit 1300 is a circuit for supplying a signal that controls a display state of the electro-optical elements 1100 on the selected line.

The temperature detection circuit 1400 is a circuit for detecting (sensing) a temperature of the electro-optical panel 1000. Since the characteristics of the electro-optical element 1100 may vary depending on the temperature, it is preferable to control the electro-optical element 1100 in accordance with the temperature. Further, a projector in which the electro-optical panel 1000 is embedded as a light bulb of the projector requires temperature information for controlling an air conditioning fan for a cooling in accordance with the internal temperature of its housing. The temperature detection circuit 1400 provides information (temperature information) for performing a control in accordance with the temperature.

Figure 11:
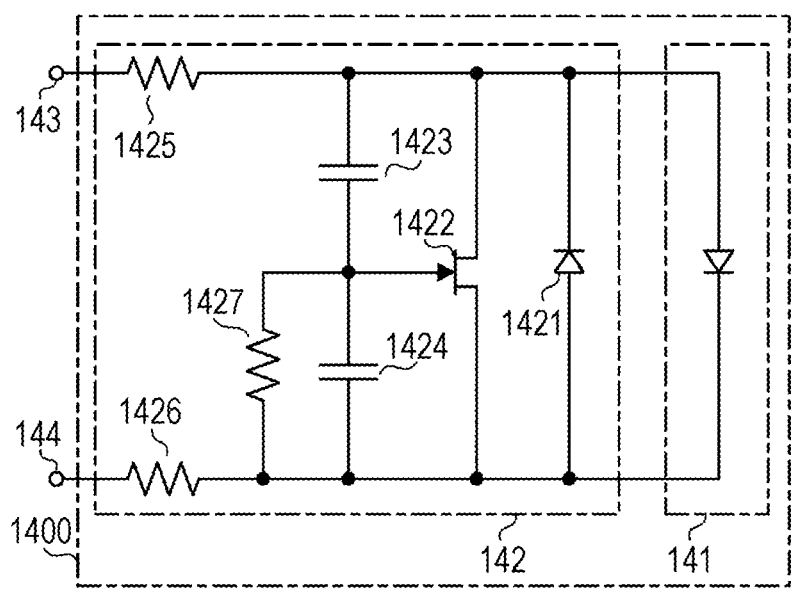
FIG. 11 is a diagram illustrating an arrangement of a temperature detection circuit.

FIG. 11 is a diagram illustrating an arrangement of the temperature detection circuit 1400. The temperature detection circuit 1400 has a temperature detection element 141, an electrostatic protection circuit 142, a terminal 143, and a terminal 144. The temperature detection element 141 has a plurality of diodes connected in series (note that one diode only is depicted). The electrostatic protection circuit 142 is a circuit for protecting the temperature detection element 141 from electrostatic discharge damage and is an example of a circuit using any one of the resistance elements 1 to 3 described in the embodiments.

The temperature detection circuit 1400 is operated as follows, for example. A constant current is supplied from a constant current source (not depicted) to the terminal 143. This current flows through the temperature detection element 141. The forward voltage of the plurality of diodes forming the temperature detection element 141 varies depending on the temperature. Therefore, the voltage between the terminal 143 and the terminal 144 varies depending on the temperature. Observation of this voltage allows temperature-related information to be obtained.

The electrostatic protection circuit 142 has a plurality of diodes 1421 (note that one diode only is depicted), an FET 1422, a capacitor 1423, a capacitor 1424, a resistor 1425, a resistor 1426, and a resistor 1427. Any one of the resistance elements 1 to 3 described in the embodiments is used as the resistors 1425 and 1426. In response to a surge due to static electricity being applied between the terminal 143 and the terminal 144, the potential of the terminal 143 side rises, for example, and the gate potential of the FET 1422 rises due to a voltage divided by the capacitances of the capacitors 1423 and 1424. The rise in the gate potential causes the FET 1422 to be turned on. Upon the FET 1422 being turned on, a current due to the surge flows into the terminal 144 side via the FET 1422. In such a way, the current due to the surge flowing in the temperature detection element 141 is suppressed by the electrostatic protection circuit 142.

Note that the circuit arrangement of the electrostatic protection circuit 142 is not limited to the above. For example, the plurality of diodes 1421 may be omitted. Further, the electro-optical panel 1000 is not limited to the SOG, and at least a part of the driving circuit 1200, the driving circuit 1300, and the temperature detection circuit 1400 may be formed separated from the glass substrate.

4. Modified Examples

The invention is not limited to the embodiments described above, but various modified implementations are possible.

Several modified examples will be described below. More than one following modified examples may be combined for use.

Figure 8A:
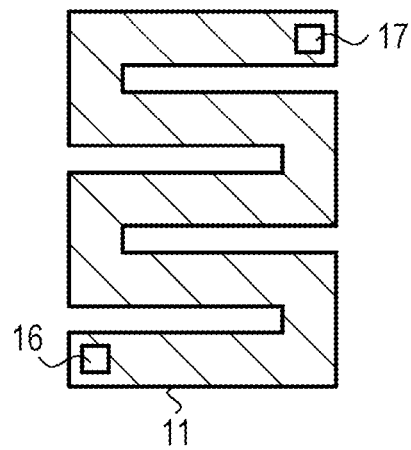
FIG. 8A is a diagram illustrating another example of the shape of a body portion.
Figure 8B:
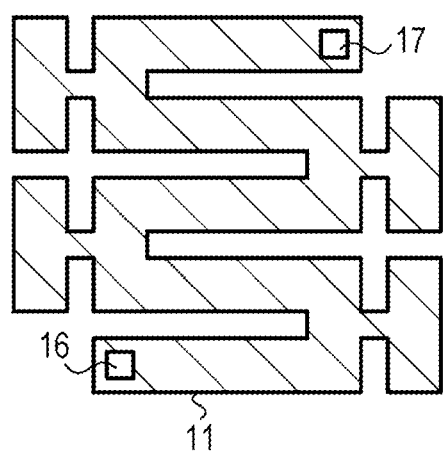
FIG. 8B is a diagram illustrating another example of the shape of the body portion.

FIG. 8A and FIG. 8B are diagrams illustrating another example of the plane shape of the body portion 11. The shape of the body portion 11 is not limited to a rectangle (a thin rectangle). In the example of FIG. 8A, the body portion 11 has a shape turning at multiple points. Compared to the case of a simple rectangle, such a turning shape of the body portion 11 allows for a larger resistance for the same distance in the straight line from the input portion to the output portion. FIG. 8B is a diagram illustrating an example of protruding portions provided to the body portion 11 of FIG. 8A. Even when the body portion 11 has a turning shape, protruding portions can be provided.

Figure 9:
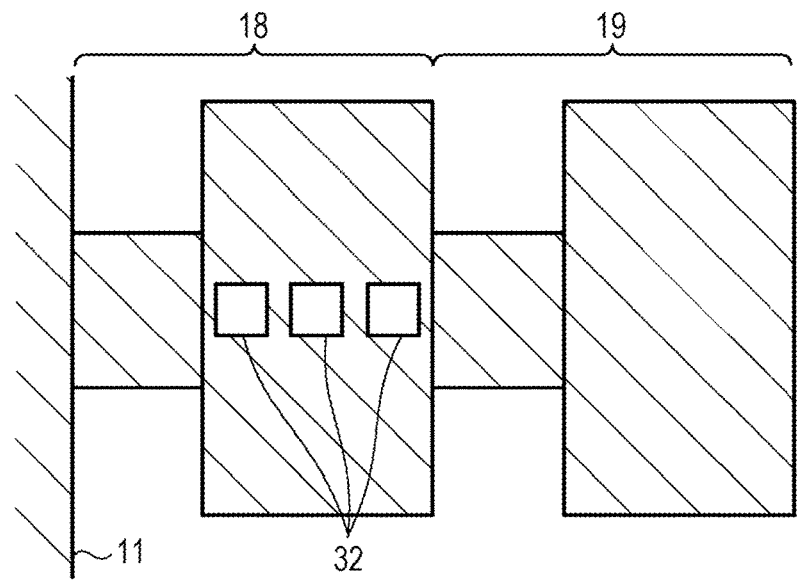
FIG. 9 is a diagram illustrating another example of the shape of protruding portions.

FIG. 9 is a diagram illustrating another example of a plane shape of protruding portions. In this example, a protruding portion 18 and a protruding portion 19 are provided to the body portion 11. The protruding portion 18 is directly connected to the body portion 11. The protruding portion 19 is not directly connected to the body portion 11, but is connected to the protruding portion 18. According to this example, since the volume of the semiconductor layer can be further increased compared to the case where the protruding portion 18 only is used, the heat dissipation can be further enhanced. Further, in this example, the contact holes 32 are aligned in the direction intersecting the current path (that extends in the vertical direction in FIG. 9) at a position corresponding to the protruding portion 18. When a plurality of contact holes are arranged at the position corresponding to one protruding portion as seen in FIG. 6, the contact holes may be aligned in the direction parallel to the current path.

Note that, if a plurality of protruding portions directly connected to the body portion were connected directly to each other, a current path would occur via the protruding portions. It is therefore desirable that the protruding portions directly connected to the body portion be separated from each other.

The layer structure of the resistance element is not limited to that exemplified in FIG. 4. For example, the resistance element may have a plurality of metal layers stacked interposing insulating layers (so-called multilayer wiring). In this case, the metal layer connected to the semiconductor layer via the through holes may be provided with another through hole for connection to another metal layer. According to this example, since the volume of the metal layer can be further increased while the area viewed in the direction perpendicular to the substrate is maintained to be constant, the heat dissipation can be further enhanced.

The shape and the number of the elements (the body portion, the protruding portion, the heat radiation portion, and the contact hole) forming the resistance element are not limited to those exemplified in the embodiments. Further, the materials for forming these elements are not limited to those described in the embodiments.

The application example of the resistance element is not limited to an electrostatic protection circuit. The resistance element according to the invention may be applied to other circuits than the electrostatic protection circuit.

The entire disclosure of Japanese Patent Application No. 2015-063903, filed Mar. 26, 2015 and No. 2015-230320, filed Nov. 26, 2015 are expressly incorporated by reference herein.

What is claimed is:

1. A resistance element comprising:
    a first electro-conductive layer that is formed on a substrate and includes a body portion, a current path from an input portion to an output portion, and a protruding portion protruding from the body portion at a position between the input portion and the output portion;
    a second electro-conductive layer that overlaps the protruding portion of the first electro-conductive layer and is formed on the first electro-conductive layer via an insulating layer by using a material having a lower resistivity than the first electro-conductive layer; and
    a connection portion that connects the first electro-conductive layer to the second electro-conductive layer and is provided through the insulating layer at a position corresponding to the protruding portion and includes a contact hole penetrating from the first electro-conductive layer to the second electro-conductive layer.

2. The resistance element according to claim 1,
    wherein the protruding portion has a first portion having a smaller sectional area of a cross section perpendicular to the substrate and parallel to the current path and a second portion having a larger sectional area of a cross section perpendicular to the substrate and parallel to the current path, and
    wherein the sectional area of the first portion is smaller than a sectional area of the body portion perpendicular to the substrate.

3. The resistance element according to claim 2, wherein a plurality of the contact holes are provided to the insulating layer at a position corresponding to the second portion.

4. The resistance element according to claim 3, wherein the plurality of contact holes are arranged in a direction intersecting the current path.

5. The resistance element according to claim 3,
    wherein the protruding portion has a first protruding portion connected to the body portion and a second protruding portion connected to the first protruding portion, and
    wherein the plurality of contact holes are arranged in the first protruding portion in a direction intersecting the current path.

6. The resistance element according to claim 1 further comprising a second protruding portion protruding from the body portion in the same direction as the protruding portion, wherein the protruding portion and the second protruding portion are separated from each other.

7. The resistance element according to claim 1, wherein the second electro-conductive layer does not extend past edges of the first electro-conductive layer in a plan view.

8. The resistance element according to claim 1, wherein the second electro-conductive layer has a smaller area than the first electro-conductive layer such that the second electro-conductive layer is surrounded by the first electro-conductive layer in a plan view.

9. The resistance element according to claim 1,
    wherein
        the protruding portion is a first protruding portion protruding from a first side of the body portion in a first direction,
        the first electro-conductive layer further includes a second protruding portion protruding from a second side of the body portion in a second direction that is opposite to the first direction, and
        the second electro-conductive layer extends from a position overlapping the first protruding portion across the body portion to a position overlapping the second protruding portion.

10. An electrostatic protection circuit comprising the resistance element according to claim 1.

11. An electrostatic protection circuit comprising the resistance element according to claim 2.

12. An electrostatic protection circuit comprising the resistance element according to claim 3.

13. An electrostatic protection circuit comprising the resistance element according to claim 4.

14. An electrostatic protection circuit comprising the resistance element according to claim 5.

15. An electrostatic protection circuit comprising the resistance element according to claim 6.

16. A temperature detection circuit comprising:
the electrostatic protection circuit according to claim 10; and
a temperature detection element electrically connected to the electrostatic protection circuit.

17. A temperature detection circuit comprising:
the electrostatic protection circuit according to claim 11; and
a temperature detection element electrically connected to the electrostatic protection circuit.

18. A temperature detection circuit comprising:
the electrostatic protection circuit according to claim 12; and
a temperature detection element electrically connected to the electrostatic protection circuit.

19. A temperature detection circuit comprising:
the electrostatic protection circuit according to claim 13; and
a temperature detection element electrically connected to the electrostatic protection circuit.

20. A temperature detection circuit comprising:
the electrostatic protection circuit according to claim 14; and
a temperature detection element electrically connected to the electrostatic protection circuit.

21. A temperature detection circuit comprising:
the electrostatic protection circuit according to claim 15; and
a temperature detection element electrically connected to the electrostatic protection circuit.

22. An electro-optical device comprising the temperature detection circuit according to claim 16.

23. An electro-optical device comprising the temperature detection circuit according to claim 17.

* * * * *